(12) United States Patent
Takita

(10) Patent No.: US 6,496,060 B2
(45) Date of Patent: Dec. 17, 2002

(54) HYBRIDIZED, HIGH PERFORMANCE PWM AMPLIFIER

(75) Inventor: Mark Takita, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/839,753

(22) Filed: Apr. 19, 2001

(65) Prior Publication Data

US 2001/0052814 A1 Dec. 20, 2001

Related U.S. Application Data

(60) Provisional application No. 60/212,086, filed on Jun. 15, 2000.

(51) Int. Cl.[7] ................................................. H03F 3/38
(52) U.S. Cl. ......................................... 330/10; 330/127
(58) Field of Search ................................... 330/10, 127

(56) References Cited

U.S. PATENT DOCUMENTS

| | | | |
|---|---|---|---|
| 5,473,410 A | | 12/1995 | Nishi |
| 5,528,118 A | | 6/1996 | Lee |
| 5,841,250 A | * | 11/1998 | Korenage et al. ........... 318/135 |
| 5,874,820 A | | 2/1999 | Lee |
| 5,973,368 A | * | 10/1999 | Pearce et al. ................ 257/368 |
| 5,990,751 A | * | 11/1999 | Takita ......................... 330/297 |
| 6,222,236 B1 | * | 4/2001 | Lamez ......................... 257/355 |
| 6,229,388 B1 | * | 5/2001 | Nalbant ....................... 330/10 |
| 6,255,714 B1 | | 7/2001 | Kossives et al. |

* cited by examiner

Primary Examiner—Michael B. Shingleton
(74) Attorney, Agent, or Firm—Liu & Liu

(57) ABSTRACT

A high performance, high-speed, cost-effective pulse width modulation circuit for the delivery of linear and efficient power to a load. The inventive aspects include: (a) removing certain MOSFET current limiting resistors and reducing impedance paths between components to decrease switching transition time; (b) providing an ultra-fast transient protection circuitry between the Gate and the Source, and between the Drain and the Source of the MOSFETs; (c) providing a hermetically sealed Faraday cage over the circuit; (d) providing a temperature sensor to monitor the temperature of the circuit; (e) providing an electrically and geometrically symmetrical circuit, having multiple pieces of interconnected substrates to reduce electrical and mechanical stress across the junctions and matching thermal coefficient of adjoining components; (f) using costly BeO material only for the substrate in the MOSFETs where most heat is generated and less costly Alumina substrate for the rest of the circuit.

17 Claims, 11 Drawing Sheets

HYBRIDIZED, HIGH PERFORMANCE PWM AMPLIFIER

This application is a Continuation-in-part (CIP) of U.S. Provisional Application Ser. No. 60/212,086 filed on Jun. 15, 2000.

BACKGROUND OF THE INVENTION

1. Field of The Invention

The present invention relates to systems for controlling the power applied to a load, and in particular to a method to improve the performance of pulse width modulation (PWM) amplification.

2. Description of Related Art

For certain load control applications, it is desirable to have a high degree of precision in terms of linearity and power transfer efficiency. For instance, photolithographic systems require high resolution when in the scanning mode. Therefore, power transfer must be highly linear for controlling the positioning stages in the photolithographic systems, requiring that a discrete change in the position control signal to result in a proportional discrete change in the output signal for the positioning stages. At other times, photolithographic systems operating in a stepping mode require rapid changes in the positioning of the stages, which demand efficient power transfer to generate large acceleration and deceleration forces.

One of the highly effective methods of power delivery control is the use of pulse modulation amplifiers. They are used to supply drive current to inductive loads, such as linear, voice-coil, and DC motors. A pulse modulation amplifier, such as a PWM amplifier, receives an analog waveform and outputs a series of square wave pulses. The square wave pulse has an amplitude and duration such that the integrated energy of the pulses is equivalent to the energy of the sampled input analog waveform multiplied by a gain factor created by the amplifier. The resulting PWM waveform may be filtered to produce an analog waveform replicating the original input waveform multiplied by the gain factor. The frequency of the desired sine wave is called the system frequency, while the frequency at which the switch operates is called the modulation or switching frequency.

a. Prior Art H-bridge PWM

A H-bridge PWM is one of many types of pulse modulation amplifiers. FIG. 1 is an example of a basic prior art H-bridge PWM circuit. It consists of 4 power transistors interconnected to form a bridge, with the load, which in this representation is a servomotor, being positioned in the center of the bridge. Each transistor (110, 120, 130, and 140) has a corresponding "free wheeling" diode 150 connected in parallel, in a reverse current direction, from the emitter to collector. The base voltages of the transistors are controlled by the switching servo amplifiers to turn the transistors 110, 120, 130 and 140 "on" and "off" in the appropriate manner so as to cause a drive current, $I_m$, to flow through the motor 170 in the desired direction.

The pairs of transistors are controlled in opposition to restrict losses via the "free-wheeling" diodes. They should not be overlapped in operation; otherwise a short circuit may occur which can result in damage to the circuit. For example, in the first half of the period, transistors 110 and 140 are switched "on" and "off" depending on the modulation frequency while transistors 120 and 130 are "off", which result in current $I_m$ flowing from Vs+100 through the transistor 110, the motor 170, the transistor 140, to Vs−100, in the direction as shown by the arrows. For the second half of the period, transistors 120 and 130 are switched "on" and "off" depending on the modulation frequency while transistors 110 and 140 are switched "off", which result in current flowing through the motor in the opposite direction. This "on" and "off" cycle of alternate pairs of transistors is continuously repeated as the servo system controls the acceleration of the motor. The direct unfiltered amplifier output is either near the supply voltage or near zero. Continuously varying filtered output levels are achieved by changing only the duty cycle. As the duty cycle or the modulation frequency is increased, the output square waves become more reflective of the sinusoidal input as shown in FIG. 2. The increase in modulation frequency also results in efficiency being quite constant as output power varies.

b. Design Considerations of PWM

The challenge of designing a pulse width modulator is to get enough dynamic range to deliver the specified output while variables such as output current, input voltage, and temperature fluctuate over wide ranges. If output current remains constant, the average energy into the filter inductor must remain constant. As input voltage rises, the energy delivered to the filter inductor in a given time must be increased. If the input voltage is constant but output current decreases, less energy must be delivered to the filter inductor. The only variable the controller has to work with is the pulse width, which must be increased or decreased depending upon the load requirement. Therefore, PWM switching control is highly critical in determining the waveform output.

Furthermore, the design of the PWM has to take into considerations the following desired parameters: low internal losses to provide high operating efficiency, leading to small size and low cost equipment; high signal-to-noise ratio to provide quality power to the load; high modulation frequency to produce a variable frequency sine wave with small ripple current and minimum harmonics to minimize motor heating; and high surge ratings to protect against overcurrent and overvoltage conditions, thus improving reliability.

The main problem to resolve for all high-power amplifier and oscillator equipment is the removal of excess thermal energy produced in active devices, which can include switching resistance, diode forward drops, copper losses, and core losses. The temperature rise of the PWM circuit must be within the allowable limit as prescribed by the manufacturer of each component. The PWM circuit therefore must be designed to withstand worst-case internal power dissipation for considerable lengths of time in relationship to the thermal time constants of the heat sinking hardware. Consequently, the PWM circuit has to have the necessary heat dissipation device to cool itself under worst-case conditions, which include highest supply voltage, lowest load impedance, maximum ambient temperature, and lowest efficiency output level. In the case of reactive loads, maximum voltage-to-current phase angle or lowest power factor must also be addressed. The available cooling methods to remove the thermal generation include natural convection, forced convection, and conduction. If the excess thermal energy is not removed properly, the temperature rise can create circuit failure and/or reduce power delivery efficiency.

The other problem to be resolved is noise, or interference, which can be defined as undesirable electrical signals that distort or interfere with the original or desired signal. Examples of noise sources include thermal noise due to electron movement within the electrical circuits, electromagnetic interference due to electric and magnetic fluxes, and other transients that are often unpredictable. The main techniques used to reduce noise consist of applying shielding around signal wires, increasing the distance between the noise source and signal, decreasing the length that the desired signal must travel, rounding off or smoothing rough edges to reduce the effects of corona, and proper grounding of the entire system.

The ratio of the signal voltage to the noise voltage determines the strength of the signal in relation to the noise. This is called signal-to-noise ratio (SNR) and is important in assessing how well power is being delivered. The higher the SNR, the better the delivery of desired power. PWM amplification system with low SNR may not be suitable for photolithography motor drives and other high performance applications, which may require noise free power.

Further, conventional PWM amplifier systems do not provide drive current in a linear fashion and typically have poor total harmonic distortion (THD) characteristics. The THD and switching transients, which are associated with very high speed rising and falling edges, can cause noise and generate excessive undershoot and overshoot ringing effects. If these voltage spikes were allowed to exist they could cause high stress and possibly destruction of both amplifier and power supply components. To resolve the ringing effects, amplifier must use fast surge suppression to prevent ringing in the output signals.

SUMMARY OF THE INVENTION

The system of the present invention addresses and overcomes the difficulties discussed above by decreasing the Metal Oxide Semiconductor Field Effect Transistor (MOSFET) switching transition time in order to reduce the non-linear effects at high speed switching, compensating for the possible overvoltage conditions, increasing the ability of the MOSFET transistor to withstand thermal and mechanical stresses, and reducing the component size. The result is a hybrid, high performance, high-speed, cost-effective, miniaturized pulse width modulation circuit.

The reduction of the MOSFET switching transition time is done by removing certain MOSFET current limiting resistors and reducing the impedance paths between components. As a result, the rise time and the fall time during the switching periods are reduced, which give the system better response in terms of preciseness power delivery and less non-linear disturbances. To compensate for the possible increase in transient voltage and to protect the MOSFET transistors, an ultra-fast transient protection circuitry is installed between the gate and the source, and between the drain and the source of the MOSFET transistors. The transient protection circuitry operates like a low-pass filter to prevent high voltage from being applied across the MOSFET and damage it.

In addition to the overvoltage effects, high frequency switching can also induce electromagnetic interferences and affect the performance of the circuit. In this invention, in addition to conventional noise suppression strategies, Faraday shielding is used to shield the circuit from electric fields generated by static electricity and attenuate the distortion caused by the electromagnetic emission.

A temperature sensor is also provided to monitor the thermal energy generated inside the circuit; it can be configured to alarm or shutdown the PWM circuit, by removing the triggering voltage to the gate of the switching transistor, when the temperature rises above a certain threshold.

The invention also increases the ability of the PWM circuit to withstand thermal and mechanical stresses by having multiple pieces of interconnected Alumina, bonded together by electrical conductors, as the substrate. This method provides more flexibility than that of the prior art, which has only one solid piece of Alumina as a substrate. By having multiples pieces, the substrate has more room to expand and contract in the area between the pieces, and more angles of rotation and eventual displacement since they can flex in unison and in opposition to each other.

The PWM H-bridge essentially contains two electrically equivalent halves. Geometric symmetry of the circuitry is used, in order to preserve electrical and thermal symmetry within the amplifier. This is important, in order to preserve the linearity, and performance of the PWM. Thermal symmetry ensures the device's thermally dependent characteristics change in unison. Geometric symmetry ensures the impedance characteristics of the two halves of the circuitry remain identical.

Furthermore, Kovar, rather than the prior art cold rolled steel, is used as the sealant and packaging material, because Kovar has a coefficient of thermal expansion that is closer to those of the substrates Alumina and Beryllium Oxide (BeO). As a result, mechanical stress across the junction is reduced.

The invention uses the costly BeO material only for the substrate in the MOSFET transistors, which generate the most heat, and uses the less costly Alumina substrate for the rest of the circuit. In the prior art, either Alumina or BeO is used for the entire circuit. Using BeO for the substrate is usually reserved for very high performance device at the expense of higher cost. In accordance with this invention, BeO is used only where it is needed, which is at the location where heat is generated the most, at the MOSFET location. This approach reduces the cost of the PWM circuit, but does not compromise the performance of the PWM circuit.

As a result of reducing the non-linear effects at high speed, protecting against over-voltage conditions, increasing the physical strength of the circuit to withstand thermal and mechanical stresses, decreasing the size of the heat sink, and reducing the cost of the circuit without compromising performance, this invention allows for the delivery of linear and efficient power to the load in a reliable and cost effective manner.

In another aspect of the present invention, a stage device is disclosed which deploys a control system that includes the PWM system in accordance with the present invention. In a further aspect of the present invention, a lithography system is disclosed which deploys a stage device that incorporates the stage device in accordance with the present invention. In yet another aspect of the present invention, an object is formed by the lithography system in accordance with the present invention.

DETAILED DESCRIPTION OF ILLUSTRATED EMBODIMENTS

The following description is of the best presently contemplated mode of carrying out the invention. The description is made for the purpose of illustrating the general principles of the invention and should not be taken in a limiting sense. The scope of the invention is best determined by reference to the appended claims.

The present invention provides for high speed switching without the non-linear effects. This is done by suppressing the unwanted signals and reducing the heat generation, which will result in improved control precision and increase in energy efficiency. At the same time, the other goal of the invention, as applied in a H-bridge PWM circuit, is to strengthen the hybrid circuit to withstand thermal and mechanical stresses, which can increase the capacity of the circuit to deliver more power.

H-bridge PWM

Figure 3:
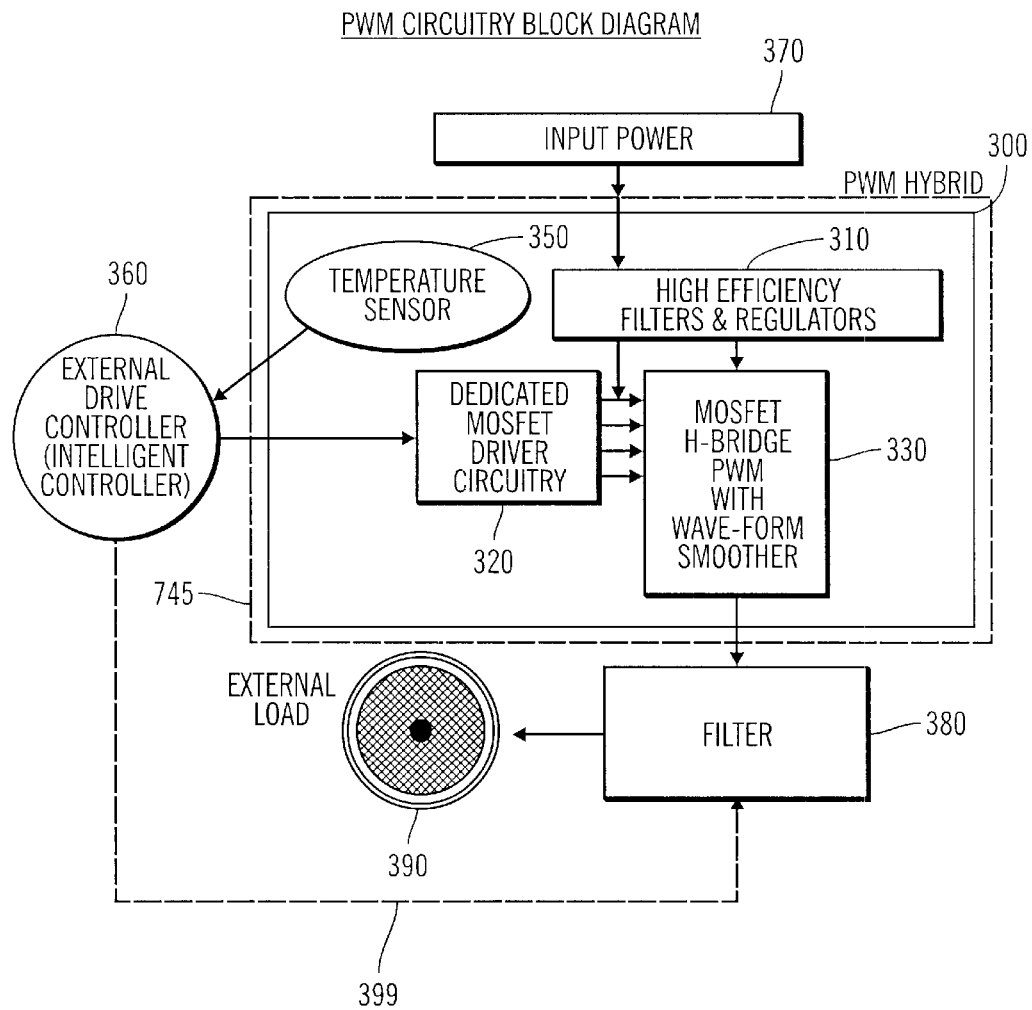
FIG. 3 is a block diagram of a H-bridge pulse width modulation circuit in accordance with e embodiment of the present invention.

FIG. 3 shows a block diagram of the PWM system in accordance with one embodiment of the present invention. The system contains improvements over prior art H-bridge PWM systems, which optimize the performance of each block of this structure. The input power Vs 370 is fed into the PWM hybrid 300, which contains, in addition to other miscellaneous devices, filters and regulators 310, MOSFET driver circuitry 320, MOSFET H-bridge PWM 330 with waveform smoother, and temperature sensor 350. The input power 370 is filtered by the filters and regulators 310 to protect against transients and overvoltage. The temperature sensor 350 monitors the temperature inside the hybrid 300 and feed the information to the external driver controller 360; and based on the internal temperature, the external drive controller 360 can do nothing, adjust the switching frequency, or send a signal to shut down the hybrid 300. The MOSFET driver circuitry 320 controls the switching of the MOSFET transistors in the MOSFET H-bridge PWM 330. The switching signal from the MOSFET driver circuitry 320 is filtered by the filters and regulators 310 prior to being sent to the MOSFET H-bridge PWM 330. As the waveforms are output from the PWM hybrid 300 to the load 390, the filter 380 suppresses additional unwanted signals based upon the system characteristics such as oscillator frequency.

External Drive Circuitry

The MOSFET digital drive signals are provided by an external source, the external drive controller 360. This allows the PWM circuit to be driven by a fixed analog oscillator or by a dynamic oscillator, controlled by a microprocessor, or a digital signal processing type device. As a result of external dynamic control, the circuit allows for greater flexibility, and increases the method and range of operations. In basic form for a constant frequency PWM type of controller, this source consists of a fixed oscillator and a digital clock. In complex form for a variable frequency PWM type of controller, the driver consists of a dynamic digital driver, which functions corresponding to the various dynamic modes to which the output is to be driven. Depending on the application, the frequency of switching may be in the range of 5 Khz to 110 Khz, and can be adjusted dynamically to compensate for various modes of operation of the prescribed load. The external drive controller 360 can have a corrective feedback, which compensates for non-linearities created by the amplifier system. Overall, the external drive circuitry has the advantage of selecting the appropriate switching frequency in order to optimize the system response.

Consequently, as the oscillator frequency is not fixed in order to maximize the flexibility of the system, the output filter 380, used to smooth out the output signals and reduce the transients and noises to an acceptable level, are also not fixed. They are dependent on the external drive controller 360 and its switching frequency (shown as dotted line 399 in FIG. 3).

H-Bridge Drive Circuitry

The MOSFET drive circuitry 320 and the MOSFET transistors of the H-bridge PWM 330 should be chosen and designed to induce high speed switching transitions. This is done in order to increase the efficiency of the H-bridge PWM, and help increase and maintain the performance of the amplifier. Minimizing the time the MOSFET switches remain under large differential voltages helps minimize power loss. Since the greatest amount of non-linear effects is observed during switching of the transistors, keeping this period of time short helps reduce the non-linear performance.

Ultra-fast Transient Protection Circuit

Voltage spikes, which are caused by switching currents at high speeds, have the potential to cause significant degradation or failure of improperly designed circuitry. For example, if the inductance of a MOSFET is 10 mH, the voltage spike caused by a 20 amp current, switched at 10 nS, through the 10 mH inductor, results in a voltage of V=L*di/dt=20 MV. Increasing the inductance will have a significant impact on the performance of this type of high speed PWM device.

Figure 4:
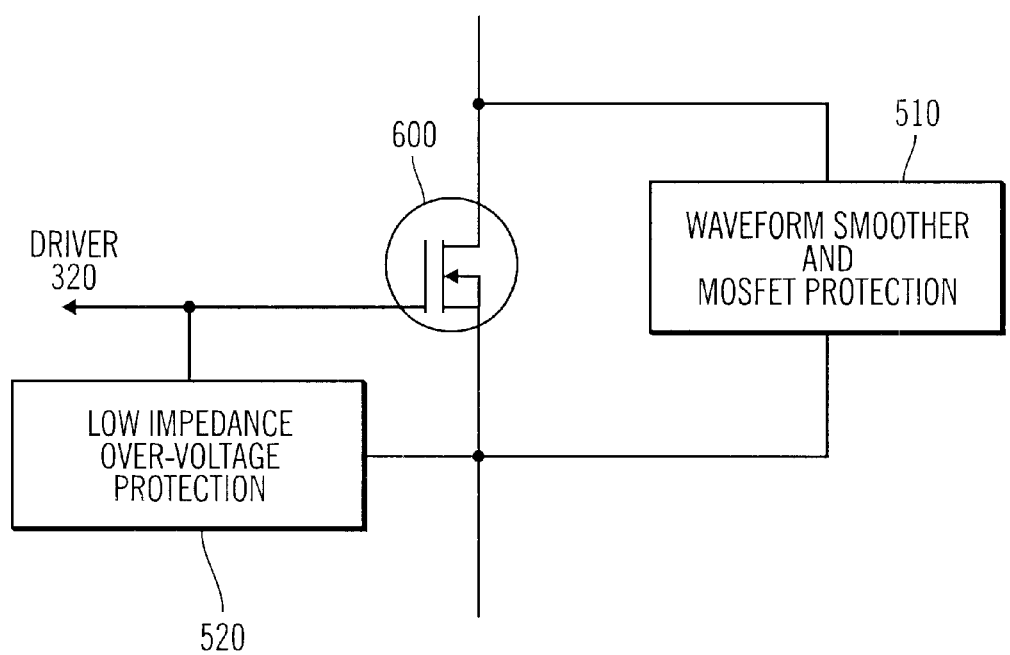
FIG. 4 is a block diagram showing the transient overvoltage protection circuitry for the MOSFET transistor.

The MOSFET gates are very sensitive to overvoltage on the gate-to-source connection, which can cause a destructive "punch-through" of the gate oxide, leading to immediate, or gradual transistor failure. The greatest problems are not caused by the driving circuitry, but rather by the load, primarily through capacitive and inductive coupling back into the gate. In order to protect against this failure mechanism, each MOSFET gate is internally protected utilizing low impedance ultra-fast transient protection circuitry. FIG. 4 shows how the waveform smoother and MOSFET protection 510 is to be applied between the drain and the source, and the low impedance overvoltage protection 520 is to be applied between the gate and the source of the MOSFET transistor 600.

Figure 1:
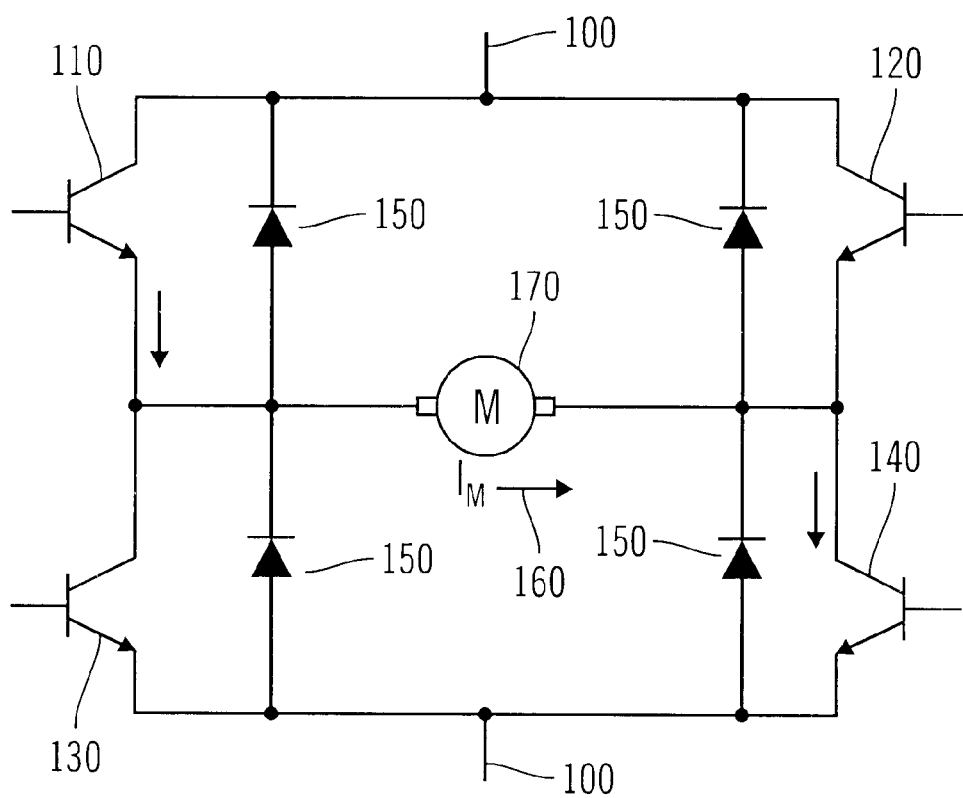
FIG. 1 is a schematic diagram of a prior art open-loop H-bridge pulse width modulation control circuit.
Figure 2:
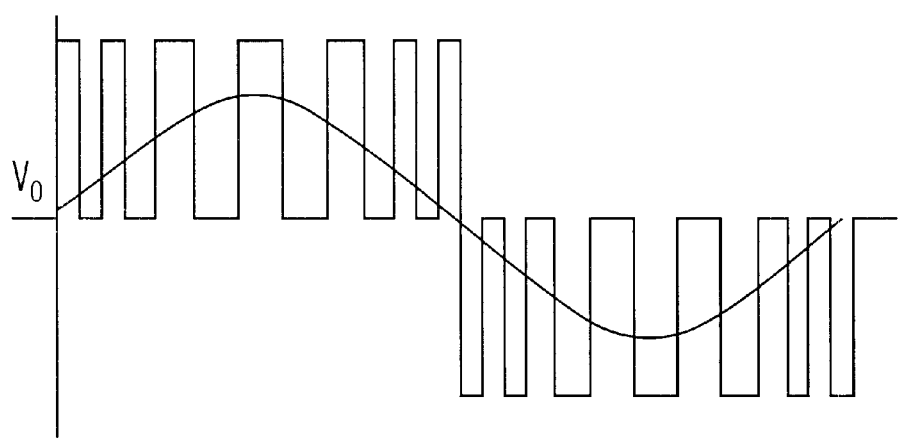
FIG. 2 is a waveform diagram illustrating the operation of the circuit shown in FIG. 1.
Figure 5A:
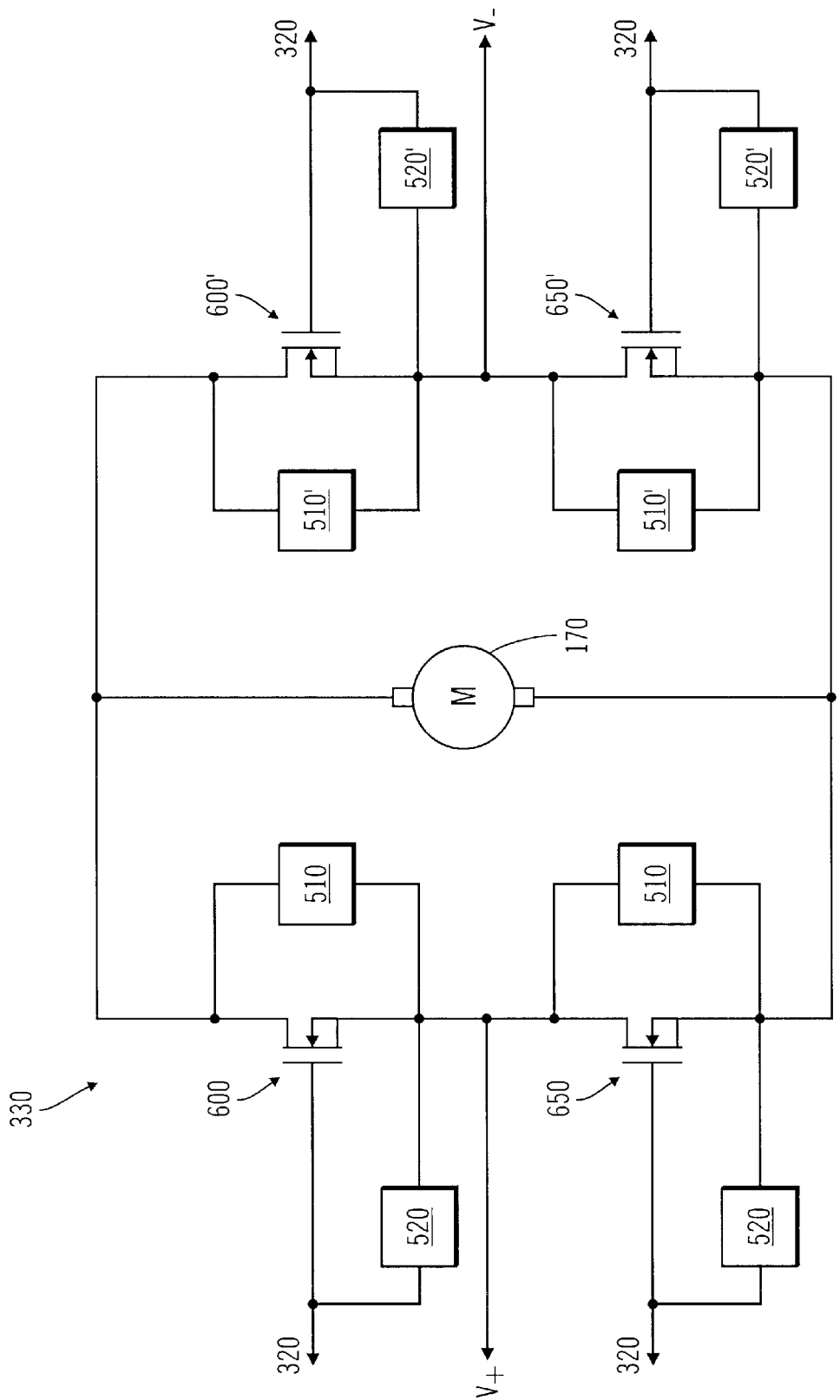
FIG. 5a is a schematic diagram showing the H-bridge PWM circuit in accordance with one embodiment of the present invention.

In its simplest form, as exemplified in FIG. 1, a H-bridge PWM circuit generally contains two electrically equivalent halves, with two transistors on each side (e.g., 110 and 130 or 120 and 140 in the prior art shown in FIG. 1). FIG. 5a shows the H-bridge PWM circuit 330 in accordance with one embodiment of the present invention. The H-bridge PWM circuit 330 essentially comprises two electrically equivalent halves, each comprises essentially two sets of the circuit shown in FIG. 4, which drive a load such as a motor 170 under power from source V+/V−. Geometric symmetry of the circuitry is used in order to preserve electrical and thermal symmetry within the amplifier. This is important, in order to preserve the linearity, and performance of the PWM. Thermal symmetry ensures the device's thermally dependent characteristics change in unison. Geometric symmetry ensures the impedance characteristics of the two halves of the circuitry remain identical.

Figure 5B:
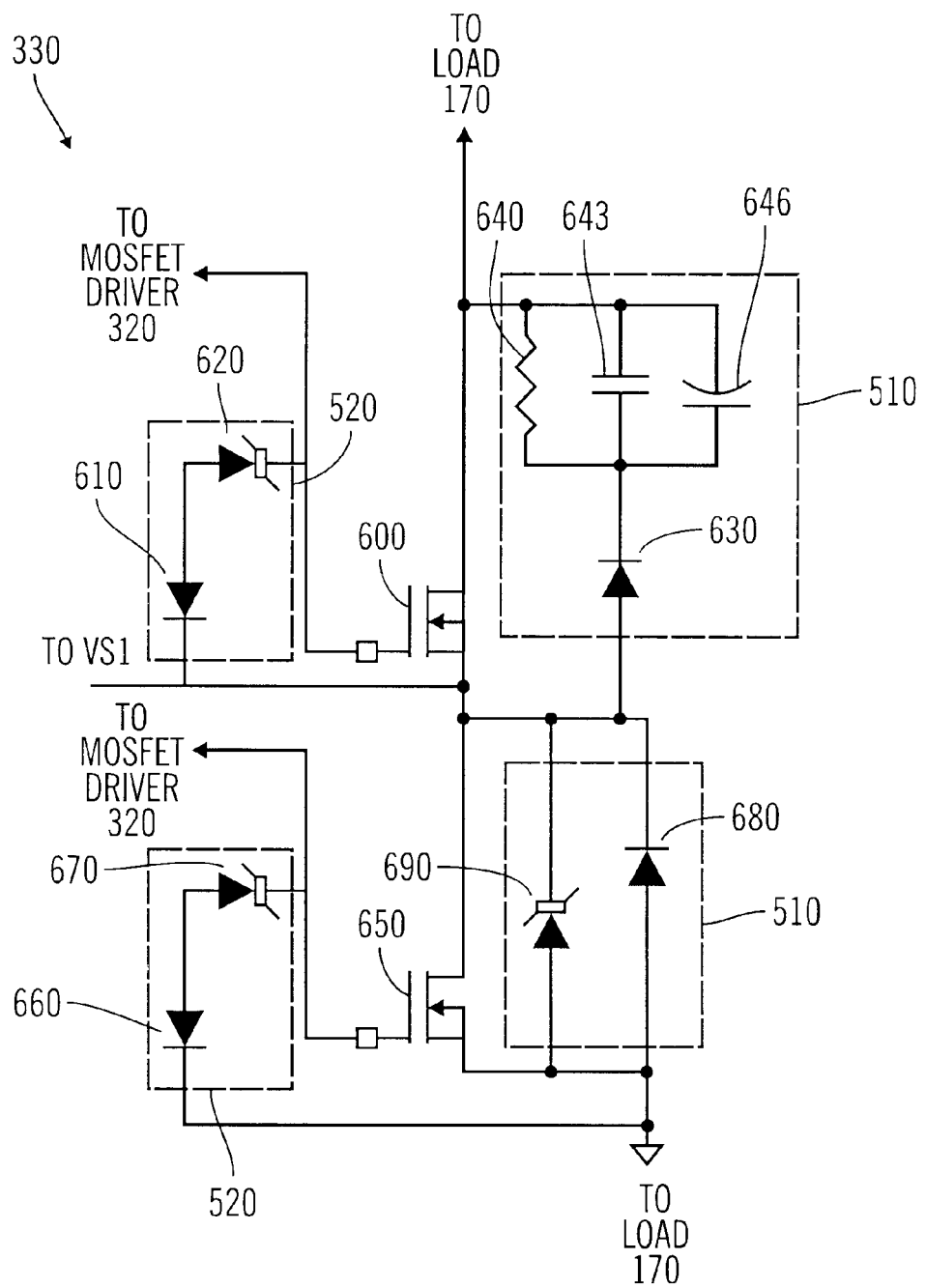
FIG. 5b is a schematic diagram showing the circuit components of the transient over-voltage protection circuitry and the waveform smoother and MOSFET protection circuitry for the MOSFET transistors in one half of the symmetrical H-bridge PWM circuit in accordance with one embodiment of the invention.

FIG. 5b shows the circuit components in one half of the symmetrical H-bridge PWM 330 in accordance with one embodiment of the invention. The gate to source protection for the MOSFET transistor 600 consists of the transient voltage suppressor (TVS) 620 connected in series with the diode 610, which together forms the low impedance overvoltage protection 520 shown in FIG. 4 and FIG. 5a. The TVS 620 protects the MOSFET transistor 600 from transients and overvoltage. The diode 610, which has very low junction capacitance, is installed in series with the TVS in order to reduce the high impedance characteristic of the TVS. Likewise the TVS 670 and the diode 660 protect the MOSFET transistor 650.

For the protection of the MOSFET transistor 650 between the drain and the source, the TVS 690 acts as the transient voltage suppressor, and it is connected in parallel with the "freewheeling" diode 680. The TVS 690 and diode 680 form part of the waveform smoother and MOSFET protection circuit 510 shown in FIG. 4 and FIG. 5a. However, for the protection between the drain and source of the MOSFET transistor 600, the waveform smoother, consisting of the resistor 640, the capacitance 643, and the capacitance 646 connected in parallel, functions as a transient voltage suppressor. In this case, the waveform smoother filters the square output waveforms and suppresses unwanted non-linear voltage transients. The resistor 640, the capacitance 643 and the capacitance 646 are coupled in series with the "freewheeling" diode 630, forming a part of the waveform smoother and MOSFET protection circuit 510 shown in FIG. 4 and FIG. 5a.

MOSFET Current Limiting Resistors Removed

Figure 6A:
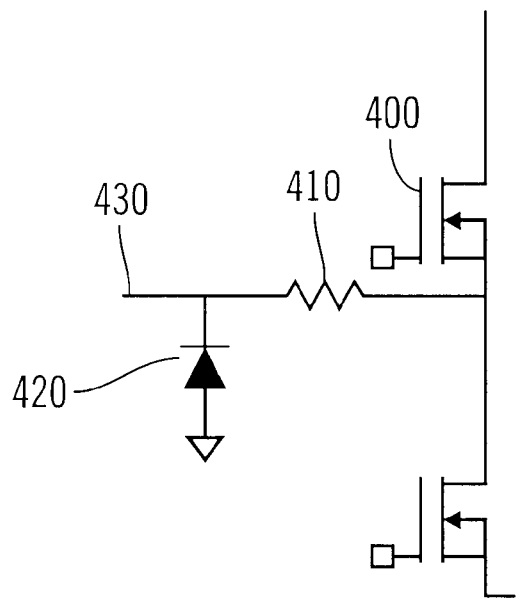
FIG. 6a and FIG. 6b are schematic diagrams comparing half the circuit of a prior art H-bridge PWM amplifier to half the circuit of a H-bridge PWM amplifier in which the gate resistor and diode are eliminated in accordance with one embodiment of the invention.
Figure 6B:
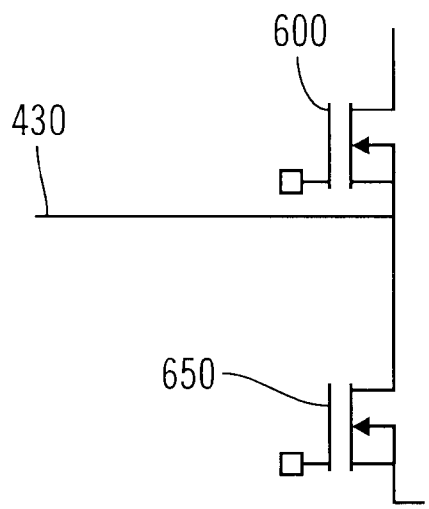

In the prior art, as shown by FIG. 6a, the gate resistor 410 and the diode 420 are added to slow the rise and fall times of voltage during switching, reduce the ringing effects and prevent VS1 430 from sinking below ground by more than 5 volts. In the present invention, the series VS1 resistor 410 and the diode 420 are eliminated for optimal energy transfer performance as shown in FIG. 6b. The downside to removing current limiting devices is the possible introduction of high applied voltage across the MOSFET transistor 600.

Faraday Shielding

Though the overvoltage protection devices protect the MOSFET transistors, they do not address the electromagnetic interferences resulting from high speed switching. The MOSFET trigger waveforms are in the nanosecond time region. This results in giga-hertz frequency components, which can disturb circuitry operation. The unwanted noise signals resulting from induced coupling at high frequencies must be shielded and reduced as much as possible. In accordance with the present invention, Faraday shielding is utilized, which involves the installation of the PWM hybrid 300 inside a hermetically sealed metal case (schematically represented by the dotted line 745 in FIG. 3). The conductive case collects stray charges and, because like charges repel, stores them on the outside surface where the charges can be further apart than they would be on the inside. The electric fields generated by these charges then cancel each other out on the inside of the case. This in turn reduces the amount of non-linearities, and noise produced by the PWM. Further, hermetically sealing the circuit also increases reliability, and decreases aging effects within the case.

Temperature Monitoring

In the case of the hybrid, the circuitry also includes an internal temperature sensor. When an active controller is used, this device can be monitored and used to turn off, or limit the output should the temperature approach the maximum operating limit. The temperature signal can also be used as a parameter in the determination of how to switch the transistor devices in order to maximize system performance. The design must be balanced between the protection provided by the temperature switch and the increased weight and the extra cost of the MOSFET gate voltage switching components.

Reduction of Thermal and Mechanical Stresses

Figure 7:
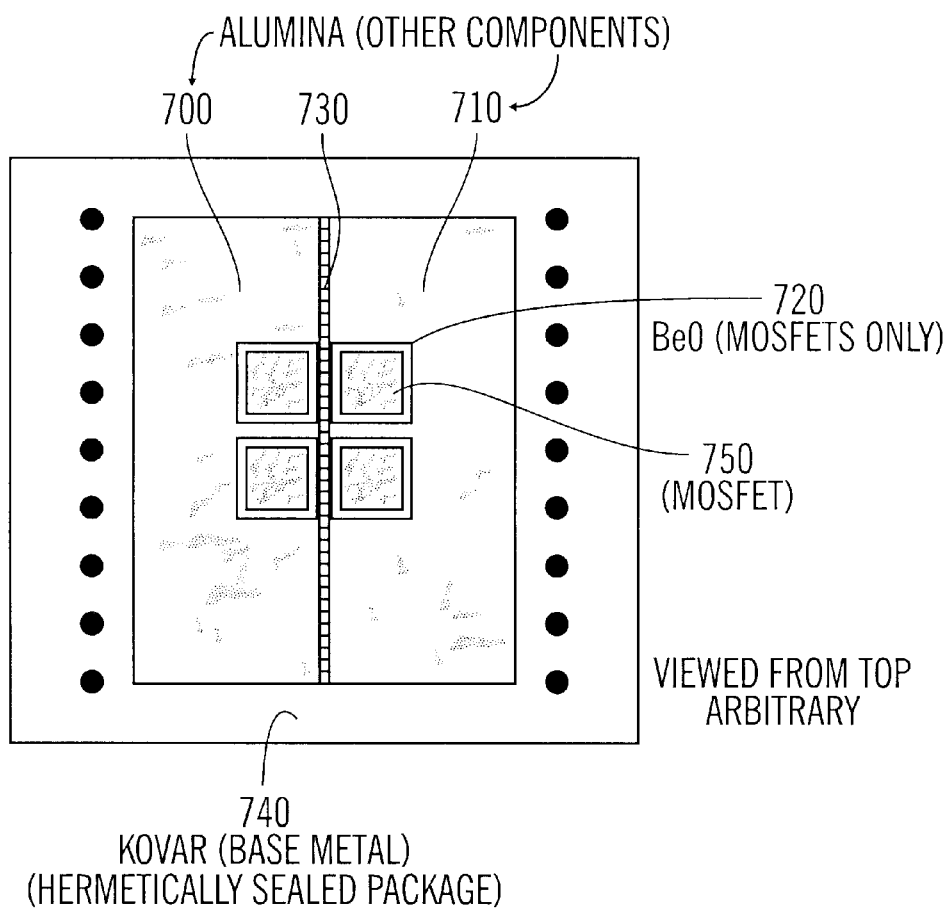
FIG. 7 is a layout of a substrate construction utilizing Alumina and Beryllium Oxide in accordance with one embodiment of the invention.

FIG. 7 illustrates how the invention can be implemented to increase the capability of the hybrid circuit to withstand thermal and mechanical stresses. The natural symmetry of the H-bridge PWM circuit shown in FIG. 1 makes it possible to separate the substrate where the components are installed onto two separate pieces. In this aspect of the invention, each MOSFET transistor 750 is mounted on a BeO substrate 720, which is in turn mounted on Alumina substrates 700 and 710. The two halves of the Alumina substrates 700 and 710 are joined together by electrical bond wires 730. The entire circuit is mounted on a Kovar base 740, and eventually hermetically sealed inside the Faraday case. The advantage of having multiple interconnected pieces of substrate is that the substrate as a whole has more room to expand and contract in the area between the pieces, and the separate substrate can flex in unison and in opposition to each other. Thermal symmetry insures the thermally dependent characteristics of the devices change in unison. As a result, the circuit is more flexible and its capability to withstand thermal and mechanical stresses is enhanced.

Matching of Thermal Coefficients

Further, the invention also reduces the thermal and mechanical stresses at the junction where unlike materials are joined. To illustrate the point, the hybrid is essentially of three layers. Layer one, the top layer, consists of the electrical components. Layer two is the substrates, Alumina and/or BeO. Layer three is the packaging material. These layers are bound together by an adhesive or metal solder. In order to insure the integrity of the brittle substrate materials, Alumina and BeO, they must expand and contract at the same rate, as the operating temperature rises and falls. Therefore, packaging materials that are selected should match the coefficients of thermal expansion of the substrate (s). In this invention, Kovar is selected as the packaging material because it has a coefficient of thermal expansion which is better matched to Alumina and BeO than typically used prior art cold rolled steel.

For example, at 21° C., Kovar has a thermal expansion coefficient of about $5.0 \times 10^{-6}$ cm/cm° C., which is closer to the thermal expansion coefficients of Alumina (96% purity), $6.1 \times 10^{-6}$ cm/cm/° C., and Beryllium Oxide (99% purity), $5.9 \times 10^{-6}$ cm/cm/° C. Cold rolled steel has a thermal expansion coefficient of about $11.5 \times 10^{-6}$ cm/cm/° C. Therefore, Kovar is better suited as a packaging material for Alumina and BeO substrates than cold rolled steel. Further, Kovar has low carbon content, which makes it more suitable for hermetically sealed enclosures.

Minimizing Beryllium Oxide

In the prior art, BeO is usually selected as the entire substrate for the thermal conduction of high wattage circuitry. It has extremely high thermal conductivity, particularly at temperature below 300° C., excellent dielectric properties, corrosion resistance, moderate mechanical strength and low thermal neutron cross-section. It is stable in nearly all dry atmospheres and is inert to most materials. However, BeO is one of the most expensive raw materials used in ceramics. Further, its pulmonary toxicity if inhaled, tends to limit its use to those applications where its extraordinary properties are mandatory.

Alumina ceramics, on the other hand, are the most widely used ceramics because they are superior to most other oxide ceramics in mechanical, thermal, and electrical properties. They are used in applications where the thermal conduction requirement is less than that of those requiring BeO. They do not generate harmful byproducts when broken or machined. Furthermore, the raw materials for Alumina are plentiful and relatively low in cost in comparison to BeO.

In accordance with the present invention, the BeO material is used only where its thermal conduction characteristic is required. FIG. 7 illustrates the layout and execution of this technique. The four MOSFET transistors 750, which generate the greatest percentage of heat within the hybrid device, are mounted separately on BeO substrates 720 before installation in the hybrid. The remaining components are mounted to Alumina ceramic substrates 700 and 710, which have been cut, usually using laser, to allow holes in which the MOSFET transistors 750 with BeO substrates 720 underneath are placed. As a result of using the least amount of an expensive and possibly harmful material BeO where required rather than using BeO as the entire substrate, the cost and hazards are reduced without compromising the thermal conduction quality of the PWM circuit.

Selection of Components

In addition to having a high performance, efficient, cost effective PWM circuit, the purpose of the invention also is to reduce the size of the hybrid in order to facilitate installation and to allow usage of the circuit where space is a premium. All components within the hybrid should be highly optimized for compatibility to the radio frequencies and hybrid conditions that they will be subjected.

Because of the need to switch large currents in small periods of time, the impedance characteristics of the capacitors must be very low in order to reduce electromagnetic emissions, prevent excessive thermal energy loss, and increase the lifetime of these components.

In accordance with the present invention, the primary bypass capacitors are co-located within the hybrid structure. These large 10 uf capacitors, occupy approximately 50% of the space within the hybrid device. By co-locating these capacitors within the hybrid, higher performance is gained by reducing the path length, and path impedance from these capacitors, to the switching MOSFETs. Significant attenuation of the V=L*di/dt voltage ringing effects from the connecting wires are gained by placing these capacitors in this location. These bypass capacitors are located on an Alumina substrate, which is located above the primary Alumina substrate. By doing this, the end hybrid can be made much more compact.

Advantages of the Inventive PWM System

The advantage of this invention is it allows rapid and precise control of the PWM waveform output, and thus improving the performance of the connected load device. Because the PWM amplifier system of the present invention is more accurate and efficient than those of the prior art, less energy is consumed and less heat is produced during operation. Further, the invention also increases the ability of the circuit to withstand higher thermal and mechanical stresses. Consequently, the reliability is increased with less damage from thermal degradation and less temperature variations, which aid in predicting the performance of the system.

In accordance with laboratory test data, the embodiment of the invention as shown in FIG. 3 achieved in a H-bridge PWM circuit with the following characteristics: total harmonic distortion of 0.05%, over a power output of 0 to 1400 watts, 96.5% power transfer efficiency at a power output of 85%. Using different components or with the advancement of transistor technologies can improve the performance. The high performance and compactness of the hybrid circuit makes it feasible to be used in the field of audio.

PWM Control for Photolithography Systems

The PWM controller of the present invention can be implemented to control drive systems in many types of systems. For example, it may be implement to control the electric motors of an exposure apparatus, such as a photolithography system. The present invention is applicable to a scanning type photolithography system (see for example U.S. Pat. No. 5,473,410), which exposes a mask pattern by moving a mask and a substrate synchronously. It is also applicable to a step-and-repeat type photolithography system that exposes a mask pattern while a mask and a substrate are stationery and moves the substrate in successive steps for exposure. It is further applicable to a proximity photolithography system that exposes a mask pattern by closely locating a mask and a substrate without the use of a projection optical system. The use of a photolithography system need not be limited to a photolithography system in semiconductor manufacturing. For instance, it can be widely applied to an LCD photolithography system, which exposes a liquid crystal display device pattern onto a rectangular glass plate, and a photolithography system for manufacturing a thin film magnetic head.

Figure 8:
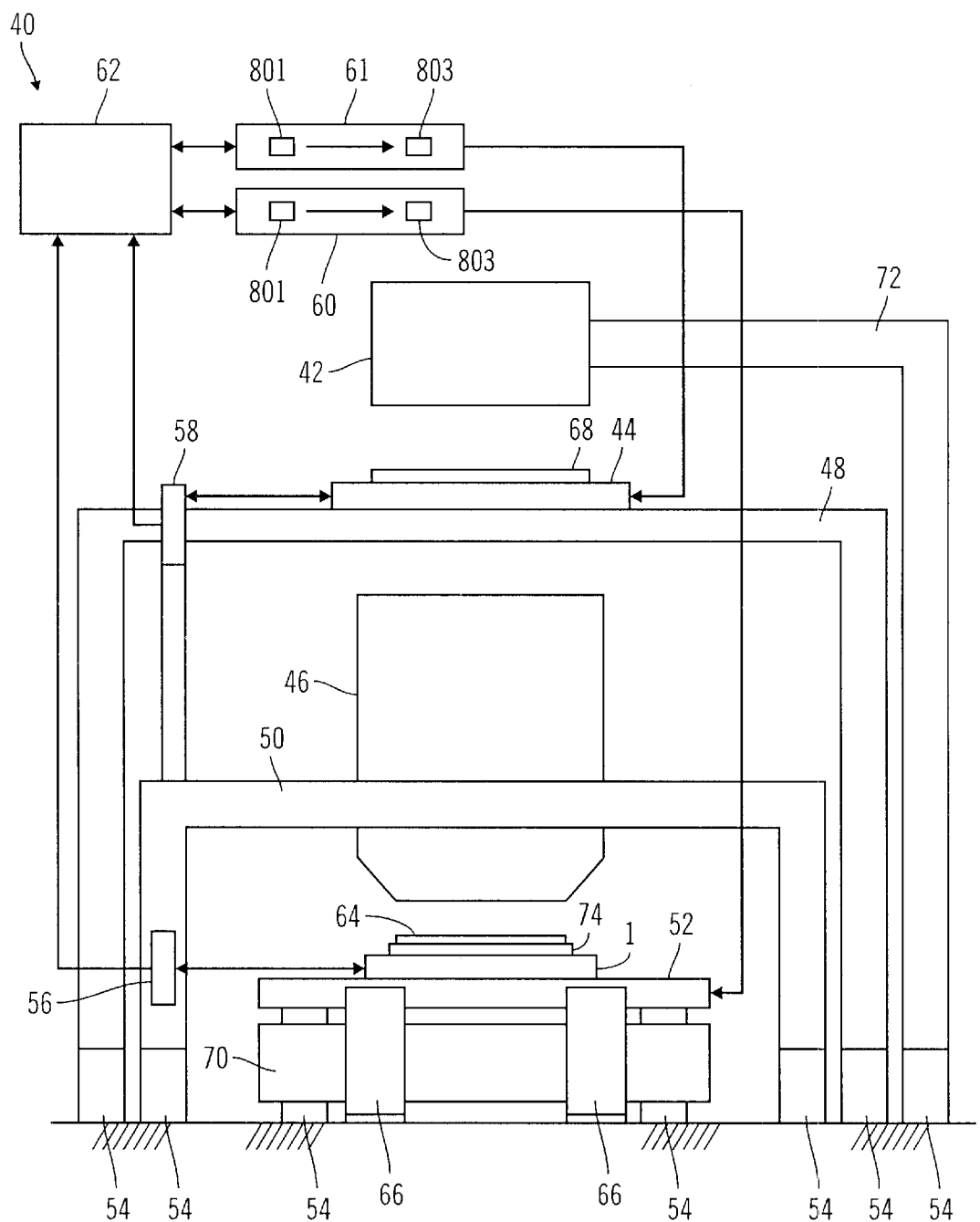
FIG. 8 s a schematic view illustrating a typical photolithography system incorporating the PWM system in accordance with the principles of the present invention.

FIG. 8 is a schematic view illustrating a photolithography apparatus 40 incorporating a wafer positioning stage 52 that is driven by a planar motor and a wafer table 1 that is magnetically coupled to the wafer stage 52 in accordance with the principles of the present invention. The planar motor drives the wafer stage 52 by an electromagnetic force generated by magnets and corresponding armature coils arranged in two dimensions. A wafer 64 is held in place by a wafer chuck 74 which is attached to the wafer table 1. The wafer stage 52 is structured so that it can move in multiple (e.g. three to six) degrees of freedom under precision control by a drive control unit 60 and system controller 62, and position the wafer 64 at a desired position and orientation relative to the projection optics 46.

The wafer table 1 is levitated in the vertical plane by preferably three voice coil motors (not shown). At least three magnetic bearings (not shown) couple and move the wafer table 1 horizontally. The motor array of the wafer stage 52 is supported by a base 70. The reaction force generated by the wafer stage 52 motion can be mechanically released to the ground through a frame 66, in accordance with the structure described in JP Hei 8-166475 (corresponding to U.S. Pat. 5,528,118), the entire contents of which are incorporated by reference herein.

An illumination system 42 is supported by a frame 72. The illumination system 42 projects a radiant energy (e.g. light) through a mask pattern on a reticle 68 that is supported by and scanned using a reticle stage 44. The movement of the reticle stage 44 is precisely controlled by a drive control unit 61 and system controller 62. The reaction force generated by motion of the reticle stage can be mechanically released to the ground through the isolators 54, in accordance with the structures described in JP Hei 8-330224 (corresponding to U.S. Pat. 5,874,820), the entire contents of which are incorporated by reference herein. The light is focused through a projection optical system 46 supported on a projection optics frame 50 and released to the ground through isolator 54. Each of the base 70, the projection optics frame 50, the reticle stage frame 48, and the frame 72 is connected to ground through isolator 54 respectively.

The magnification of the projection optical system is not limited to a reduction system. It could be a 1× or a magnification system. When far ultra-violet rays such as excimer laser is used, glass materials such as quartz and fluorite that transmit far ultra-violet rays should be used. When F2 laser or X-ray is used, the optical system should be either catadioptric or refractive (the reticle should also be a reflective type). When an electron beam is used, electron optics should consist of lenses and deflectors, and the optical path for the electron beam should be in a vacuum. The light exposes the mask pattern onto a layer of photoresists on a wafer 64. The light source for the photolithography system may be the g-line (436 nm), I-line (365 nm), KrF excimer laser (248 nm), ArF excimer laser (193 nm) and F2 laser (157 nm). For certain lithography systems, charged particle beams such as X-ray and electron beam may be used. For instance, for electron beam lithography, thermionic emission type lanthanum hexaboride (LaB6) or tantalum (Ta) can be used as an electron gun. Further, for electron beam lithography, the structure could be such that either a mask is used or a pattern can be directly formed on a substrate without the use of a mask.

An interferometer 56 is supported on the projection optics frame 50 and detects the position of the wafer table 1 and outputs the information of the position of the wafer table 1 to the system controller 62. A second interferometer 58 is supported on the reticle stage frame 48 and detects the position of the reticle stage 44 and outputs the information of the position to the system controller 62.

The system controller 62 controls each of the drive control units 60 and 61 for the reticle stage 44 and the wafer stage 52 based on the information of the positions outputted from the interferometers 56 and 58 and the desired positions of the reticle stage 44 and wafer stage 52. Each drive control unit 60 and 61 includes a PWM controller 801 in accordance with the present invention and a PWM drive 803. The PWM controller 62 controls the PWM drive 803, which feeds power to, for example, the planar motor of the wafer stage 52 and the linear motor of the reticle stage. The PWM controller 801 and the PWM drive 803 should be installed close to the motors of the reticle stage 44 and wafer stage 52 to reduce power conduction loss and voltage drop. The linear and planar motor may comprise a magnet array and a coil array facing the magnet array. Either one of the magnet array or coil array may be connected to the moving member of the stage and the other may be connected to the frame 48 or 66.

In the structure of FIG. 8, the PWM controller 801 may include the External Drive Controller 360 shown in FIG. 3. In an alternate embodiment not shown, the system controller 62 may include the External Drive Controller 360. The PWM drive 803 corresponds to the PWM hybrid 300 and filter 380 shown in FIG. 3, and each coil of the coil array corresponds to the external load 390. The system controller 62 controls the External Drive Controller (PWM controller 801) (or in the alternate embodiment the system controller 62 includes the PWM controller). Further, the input power 370 of FIG. 3 corresponds to the signal output from the system controller 62 to the PWM hybrid 300 in the drive control unit (60 or 61).

There are a number of different types of lithographic devices in which the present invention may be deployed. For example, the exposure apparatus 40 can be used as scanning type photolithography system that exposes the pattern from the reticle onto the wafer with the reticle and wafer moving synchronously. In a scanning type lithographic device, the reticle is moved perpendicular to an optical axis of the projection optics 46 by the reticle stage assembly 44 and the wafer is moved perpendicular to an optical axis of the projection optics 46 by the wafer stage assembly (1, 52). Scanning of the reticle and the wafer occurs while the reticle and the wafer are moving synchronously.

Alternately, the exposure apparatus 40 can be a step-and-repeat type photolithography system that exposes the reticle while the reticle and the wafer are stationary. In the step and repeat process, the wafer is in a constant position relative to the reticle and the projection optics 46 during the exposure of an individual field. Subsequently, between consecutive exposure steps, the wafer is consecutively moved by the wafer stage perpendicular to the optical axis of the projection optics 46 so that the next field of the wafer 64 is brought into position relative to the projection optics and the reticle for exposure. Following this process, the images on the reticle are sequentially exposed onto the fields of the wafer so that the next field of the wafer is brought into position relative to the projection optics 46 and the reticle.

Further, the present invention can also be applied to a proximity photolithography system that exposes a mask pattern by closely locating a mask and a substrate without the use of a lens assembly.

As described above, a photolithography system according to the above-described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9:
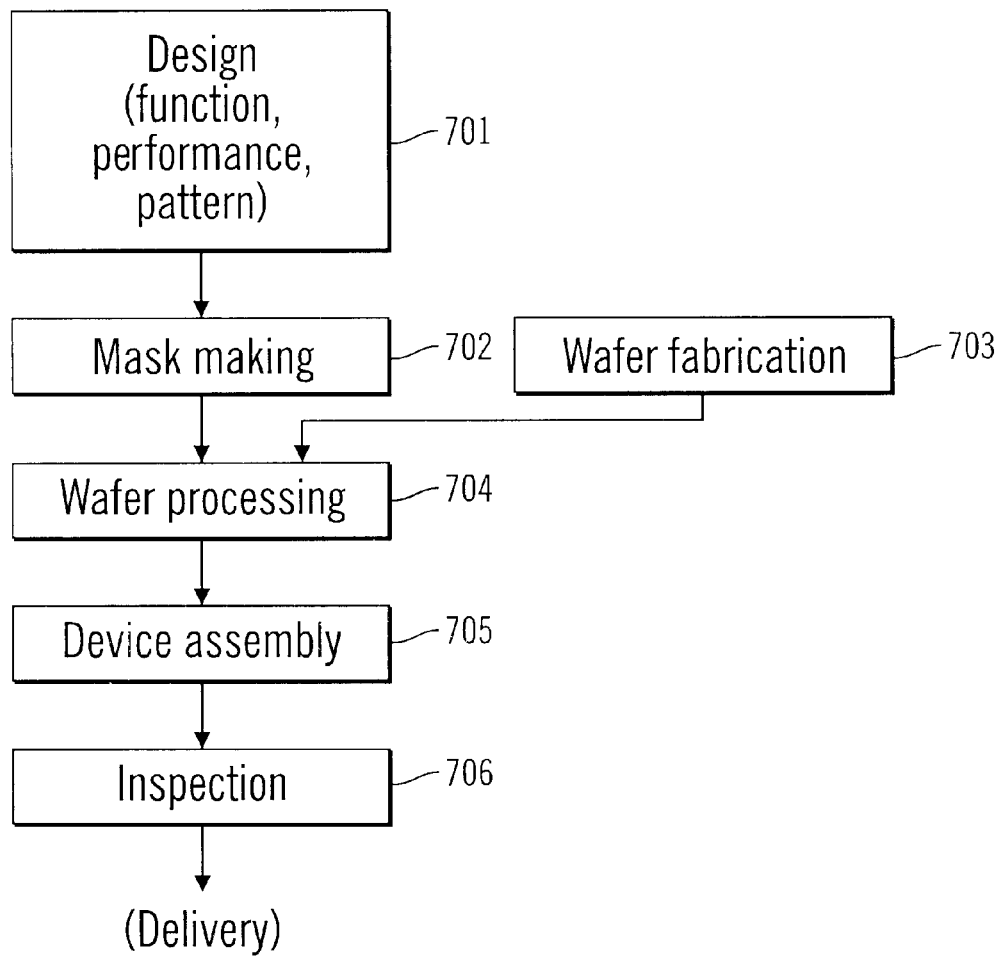
FIG. 9 is a block diagram of a general fabrication process for semiconductor devices.

Further, semiconductor devices can be fabricated using the above described systems, by the process shown generally in FIG. 9. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705 the semiconductor device is assembled (including the dicing process, bonding process and packaging process), then finally the device is inspected in step 706.

Figure 10:
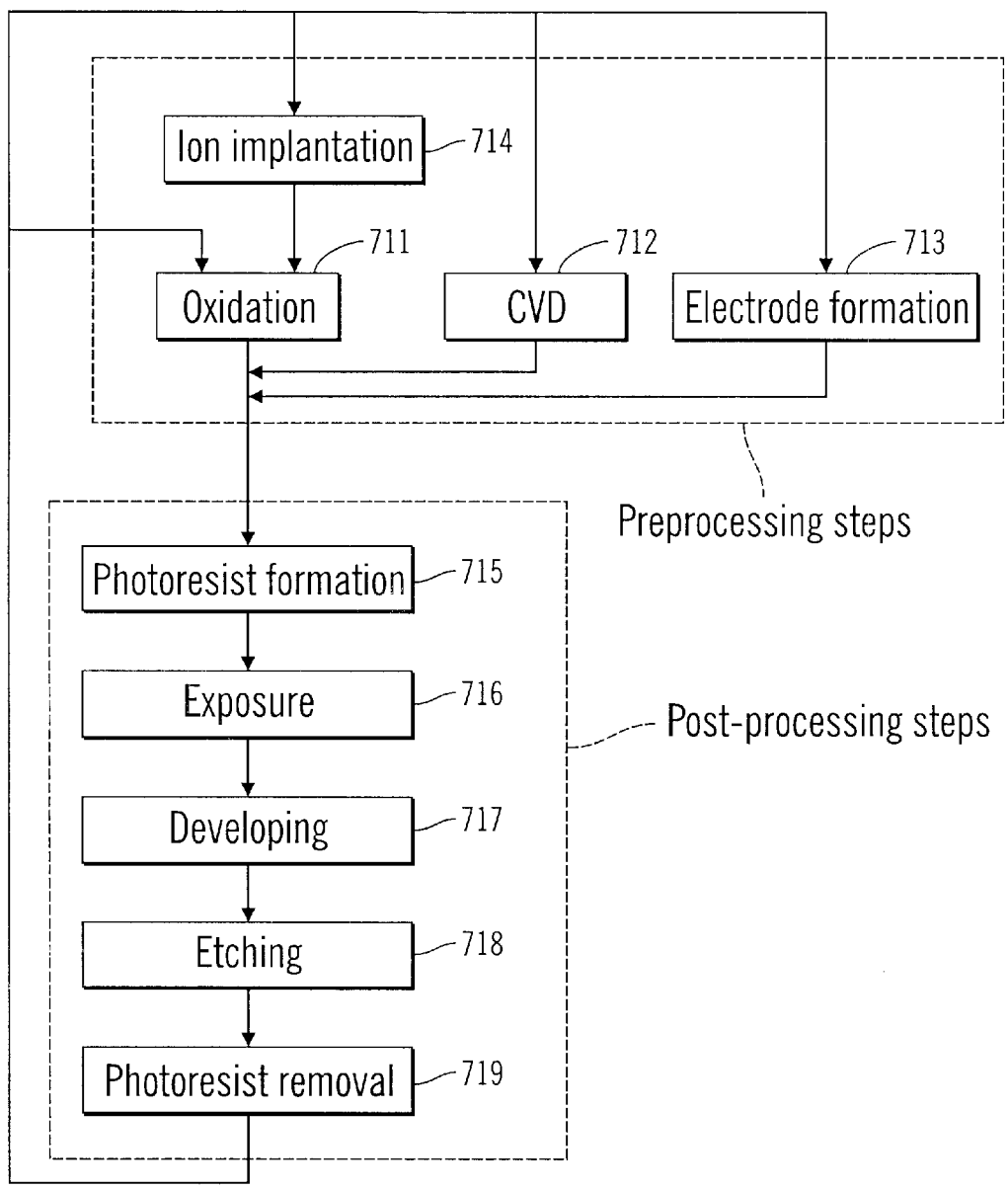
FIG. 10 is a detailed block diagram of fabricating semiconductor devices.

FIG. 10 illustrates a detailed flowchart example of the above-mentioned step 704 in the case of fabricating semiconductor devices. In FIG. 10, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above-mentioned steps 711–714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then, in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

It is to be understood that the photolithography system may be different than the one shown herein and other types of exposure apparatus and apparatus having PWM drives may be implemented with the PWM control of the present invention without departing from the scope and spirit of the invention.

While the present invention is described herein with reference to particular applications, it should be understood that the invention is not limited hereto. It will be apparent to those skilled in the art that various modifications and improvements may be made without departing from the scope and spirit of the invention. For example, the inventive concepts herein may be applied to any forms of load control where the controller can be a field programmable gate array, digital signal processor, microprocessor, programmable logic controller, or another other electrical equipment with processing capability. It could be implemented as a hybridized module, which contains all the electronics necessary to perform the amplification function. The location of the processor and any of the signals can be placed locally and/or remotely via a network. The load can be precise power amplification, such as that required for high fidelity audio systems; other precision amplification, such as that of positioning stages within semiconductor lithography equipment; or any other motor that requires accurate control. Accordingly, it is to be understood that the invention is not to be limited by the specific illustrated embodiments, but only by the scope of the appended claims.

I claim:
1. A PWM system that delivers power to a load in response to an input signal, comprising:
a hybridized PWM amplifier that comprises:
a MOSFET H-bridge PWM that comprises at least two adjoining structures of different materials having matching thermal coefficients of expansion;
a filter filtering the input signal to provide an input to the MOSFET H-bridge PWM to protect against overvoltage at the MOSFET H-bridge;
a MOSFET driver controlling switching of MOSFETs in the MOSFET H-bridge PWM to generate pulses to drive the load; and
a controller controlling operation of the hybridized PWM amplifier.

2. A PWM system as in claim 1, wherein the controller controls the MOSFET driver to control the MOSFETs to generate pulses of varying frequency.

3. A PWM system as in claim 1, wherein the hybridized PWM amplifier further comprises a temperature sensor monitoring temperature of the hybridized PWM amplifier, and wherein the controller controls the operation of the hybridized PWM amplifier in reponse to the temperature monitored.

4. A PWM system as in claim 1, wherein each MOSFET has a gate, a source and a drain, and wherein each MOSFET is free of current limiting resistor at the gate.

5. A PWM system as in claim 4, further comprising a transient protection circuit between the gate and the source of each of the MOSFETs.

6. A PWM system that delivers power to a load in response to an input signal, comprising:
a hybridized PWM amplifier that comprises:
a MOSFET H-bridge PWM having a plurality of MOSFETs, said MOSFETs each having a gate, a source, a drain, a first transient protection circuit between the gate and the source, and a second transient protection circuit between said drain and said source;
a filter filtering the input signal to provide an input to the MOSFET H-bridge PWM to protect against overvoltage at the MOSFET H-bridge; and
a MOSFET driver controlling switching of MOSFETs in the MOSFET H-bridge PWM to generate pulses to drive the load; and
a controller controlling operation of the hybridized PWM amplifier.

7. A PWM system that delivers power to a load in response to an input signal, comprising:
a hybridized PWM amplifier that comprises:
a MOSFET H-bridge PWM;
a filter filtering the input signal to provide an input to the MOSFET H-bridge PWM to protect against overvoltage at the MOSFET H-bridge;
a MOSFET driver controlling switching of MOSFETs in the MOSFET H-bridge PWM to generate pulses to drive the load; and
a controller controlling operation of the hybridized PWM amplifier; and
a hermetically sealed Faraday cage encasing the hybridized PWM amplifier.

8. A PWM system as in claim 1, wherein the MOSFET H-bridge PWM comprises a substantially electrically symmetric circuit.

9. A PWM system that delivers power to a load in response to an input signal, comprising:
a hybridized PWM amplifier that comprises:
a MOSFET H-bridge PWM that comprises a substantially geometrically symmetric circuit, to preserve electrical and thermal synnetry within the MOSFET H-Bridge PWM;
a filter filtering the input signal to provide an input to the MOSFET H-bridge PWM to protect against overvoltage at the MOSFET H-bridge;
a MOSFET driver controlling switching of MOSFETs in the MOSFET H-bridge PWM to generate pulses to drive the load; and
a controller controlling operation of the hybridized PWM amplifier.

10. A PWM system as in claim 9, wherein the MOSFET H-bridge PWM further comprises at least two substantially symmetrical pieces of interconnected substrates supporting the MOSFETs to reduce electrical and mechanical stress.

11. A hybridized PWM amplifier for generating power to drive a load, comprising MOSFET H-bridge amplifier, and a structure including at least one of the following improvements:
   (a) each MOSFET having a gate, a source and a drain, the MOSFETs are free of current limiting resistors at the gates;
   (b) a transient protection circuitry between the gate and the source of the MOSFET;
   (c) a transient protection circuitry between the drain and the source of the MOSFET;
   (c) a hermetically sealed Faraday cage encasing the hybridized PWM amplifier;
   (d) a temperature sensor monitoring the temperature of the hybridized PWM amplifier;
   (e) a substantially electrically symmetric circuit in the MOSFET H-bridge amplifier;
   (f) a substantially geometrically symmetric circuit in the MOSFET H-bridge;
   (g) at least two pieces of interconnected substrates to reduce electrical and mechanical stress across the junctions;
   (h) matching thermal coefficient of adjoining structures;
   (f) a first substrate supporting each MOSFET, the first substrate comprising a first material having a first thermal conductivity, and a second substrate supporting the first substrate, the second substrate comprising a second material having a second thermal conductivity less than the first thermal conductivity.
   (g) the first material comprises BeO and the second material comprises Alumina.

12. A PWM system as in claim 1, wherein the MOSFET H-bridge PWM comprises at least two adjoining substrates.

13. A PWM system as in claim 12, wherein the MOSFET H-bridge PWM comprises a first substrate supporting the MOSFETs, the first substrate comprises a first material having a first thermal conductivity, and a second substrate supporting the first substrate, the second substrate comprises a second material having a second thermal conductivity less than the first thermal conductivity.

14. A PWM system as in claim 13, wherein the first material comprises BeO and the second material comprises Alumina.

15. A stage device comprising:
   a supporting member that supports an object;
   a motor connected to the supporting member, the motor moving the supporting member; and
   a control system including the PWM system of claim 1, the control system being connected the motor and providing the power to the motor.

16. An exposure system comprising:
   an illumination system that irradiates radiant energy; and
   the stage device according to claim 15, said stage device carrying an object disposed on a path of said radiant energy.

17. An object on which an image has been formed by the exposure system of claim 16.

* * * * *